July 12, 1966 A. K. DORSMAN 3,260,947

DIFFERENTIAL CURRENT AMPLIFIER WITH COMMON-MODE REJECTION AND MULTIPLE FEEDBACK PATHS

Filed Nov. 1, 1963 2 Sheets-Sheet 1

INVENTOR.
ADRIAN K. DORSMAN

INVENTOR.
ADRIAN K. DORSMAN 3,260,947

DIFFERENTIAL CURRENT AMPLIFIER WITH COMMON-MODE REJECTION AND MULTIPLE FEEDBACK PATHS

Adrian K. Dorsman, Bellflower, Calif., assignor to North American Aviation, Inc.

Filed Nov. 1, 1963, Ser. No. 320,689
8 Claims. (Cl. 330—17)

This invention relates to an amplifier, and more particularly to a differential current amplifier.

The ideal current amplifier is characterized as having zero input impedance and infinite output impedance.

Any current flowing into such a device would not generate a voltage because of the zero input impedance, and the input power to the device would therefore be zero.

An ideal differential voltage amplifier will amplify only the instantaneous difference between two input signals. If the two input signals are equal in magnitude the output should be zero. In practical differential voltage amplifiers this does not occur and signals common to both input channels are amplified.

A figure of merit that is used to compare differential voltage amplifiers based on the rejection of common input signals is called the "common mode rejection ratio." The "common mode rejection ratio" is defined as: the ratio of the gain for non-identical input signals to the gain for identical, or common mode, input signals.

In many prior known differential amplifiers, the objective is to provide differential signal gain while rejecting common mode voltages, and to provide a high input impedance to minimize loading of the source. Typical transistorized differential voltage amplifiers have input impedance up to 200K ohms. Thus, such amplifiers may be judiciously applied in amplifying signals from sources having an output impedance of several K ohms, but would be unsuitable in amplifying signals from sources having an output impedance of several megohms or higher.

Differential capacitance type mechanical motion-to-electrical signal transducers as used on gyroscopes and velocity meters typically have output impedance levels of 10 megohms or more. To effect an impedance match between the existing differential voltage amplifiers and the differential capacitance transducers, a transformer is now used. The transformer reduces the output impedance of the transducer to a value compatible with existing differential voltage amplifiers.

The type of transformer necessary for the reduction in impedance is difficult to fabricate, and is highly sensitive to shock, temperature and magnetizing currents. It would therefore be highly desirable to replace the transformer with an amplifier which could duplicate the desirable features of the transformer and also provide some signal gain. Such an amplifier would ideally offer zero input impedance to current flow, so that the input current flow would be limited only by the source output impedance.

The requirements outlined in the previous paragraphs generated a need that can be met by a device that combines the ideal current amplifier and the differential voltage amplifier. Such a device will have: a zero input impedance, which could be shunted with an arbitrary impedance to ground and exhibit no detrimental effects; a complete elimination of common mode voltages at the input terminals, which in turn eliminates any error current that could be generated by an unbalance in the output conductance of the transducers. Accordingly, it is a principal object of the present invention to amplify currents while presenting a minimum impedance to the current source. It is still a further object of the invention to amplify differential currents while rejecting common mode currents.

The above and various other objectives of this invention will be more apparent from a study of the following specification when read in conjunction with the drawings, which illustrate specific embodiments for the purpose of illustrating the principles of the invention.

Figure 1:
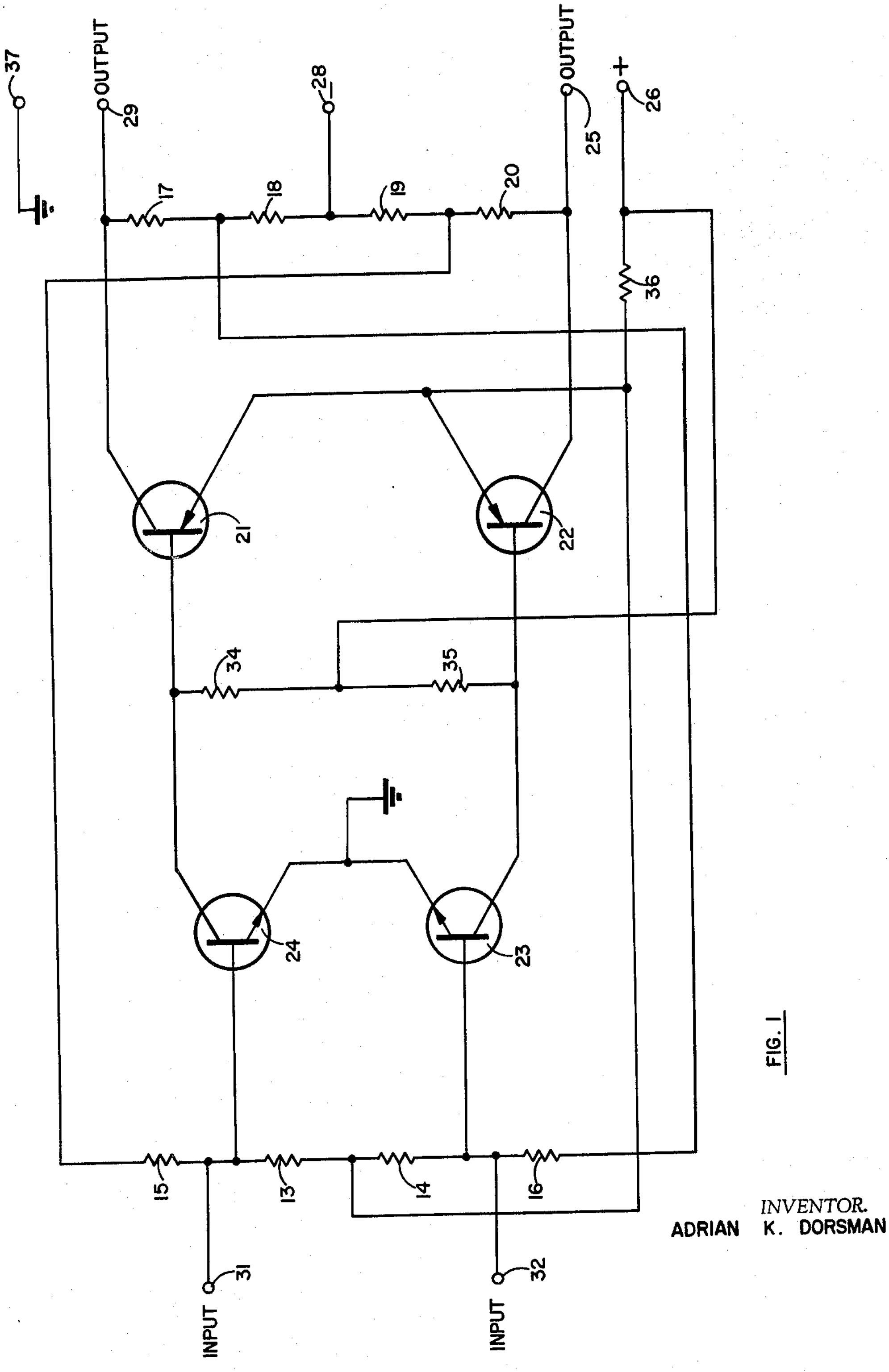
FIG. 1 is a schematic diagram of one embodiment of the invention.

Referring to FIG. 1, the transistor amplifier includes two NPN transistors 23 and 24, and two PNP transistors 21 and 22, each transistor having a base, emitter and collector. The input currents (not shown), of which the difference is to be measured, are applied to the terminals 31 and 32 and are referenced to terminal 37 (ground).

Terminal 31 is connected to the base of transistor 24, and terminal 32 is connected to the base of transistor 23. The emitters of transistors 23 and 24 are connected to terminal 37. The collectors of transistors 23 and 24 are connected through resistors 35 and 34 respectively to terminal 26.

A voltage source (not shown) that is positive with respect to terminal 37 is connected from terminal 26 to terminal 37. The collector of transistor 24 is connected to the base of transistor 21, and the collector of transistor 23 is connected to the base of transistor 22. The emitters of transistors 21 and 22 are connected together and are connected to the bases of transistors 23 and 24 through resistors 14 and 13 respectively. Resistors 13 and 14 are a means by which negative feedback of the common mode current signal is accomplished. The emitters of transistors 21 and 22 are also connected by resistor 36 to terminal 26. The collector of transistor 21 is connected by resistors 17 and 18 connected in series to terminal 28. A voltage source (not shown) which is negative with respect to terminal 37 is connected from terminal 28 to terminal 37. The collector of transistor 22 is connected by resistors 19 and 20 connected in series to terminal 28. Resistor 15 is connected from the junction of resistors 19 and 20 to the base of transistor 24. Resistor 16 is connected from the junction of resistors 17 and 18 to the base of transistor 23.

The collectors of transistors 21 and 22 are connected to terminals 29 and 25 respectively. The differential output voltage is detected across terminals 29 and 25. Terminal 37 is connected to ground and serves as a signal and voltage reference point.

In operation of the apparatus of FIG. 1, the positive voltage applied to terminal 26, in combination with resistors 13, 14, 34 and 35, biases transistors 21, 22, 23 and 24, into conduction. Voltages $V_{be1}$, $V_{be2}$, $V_{be3}$ and $V_{be4}$ are developed between the base and emitter junctions of transistors 21, 22, 23 and 24 respectively. For the purpose of analysis it will be assumed that transistors 24 and 23, and transistors 21 and 22 are matched pairs and that resistor 13 equals resistor 14 in value, and resistor 34 equals resistor 35 in value.

With the above assumptions it may be said that $V_{be1}$ is equal to $V_{be2}$ and $V_{be3}$ is equal to $V_{be4}$. The voltages $V_{be1}$, $V_{be2}$, $V_{be3}$ and $V_{be4}$ are determined by the electrical-physical characteristics of the transistors. For transistors in general use, the $V_{be}$ voltage drop is approximately .5 volt; this voltage remains fairly constant over normal transistor operating ranges, and will be neglected in the following discussion.

The current that leaves terminals 31 and 32 will be called the input current. The current leaving terminal 31 will be called $I_1$, and the current leaving terminal 32 will be called $I_2$. Starting with a balanced input signals, the currents $I_1$ and $I_2$ will be equal.

The currents $I_1$ and $I_2$ flow through resistors 13 and 14 respectively, and increase the voltage drop across these resistors. The effect achieved is similar to connecting resistors across the base-emitter junctions of transistors 23 and 24. The effective impedance measured from the input terminals 31 and 32 to ground decreases.

The voltage drop across resistors 13 and 14 appears on the bases of transistors 24 and 23 respectively, and results in a change of their base currents, which in turn results in a proportional change in their collector currents. As previously assumed, transistors 23 and 24 are matched; therefore, the change in collector currents is equal. Transistors 21 and 22 amplify the current change coupled to their bases and change their collector currents proportionally. If the collector currents of transistors 21 and 22 are equal, no voltage differential occurs across terminals 29 and 25 and there is no output.

Common mode current rejection is accomplished in this circuit by summing the emitter currents of transistors 21 and 22 through resistor 36 and feeding back to the junction of resistors 13 and 14, the voltage developed across the emitters of transistors 21 and 22 and ground. The polarity of this voltage is such as to cause $I_1$ and $I_2$ to flow through resistors 13 and 14. The effect of ideally having zero impedance to common mode currents is hereby achieved.

If the input currents $I_1$ and $I_2$ are different in magnitude, this difference will be detected and amplified by the first stage consisting of transistors 21 and 22. The difference in input current will then appear as a voltage difference across the output terminals 25 and 29.

Feedback resistors 15 and 16 are used to decrease the gain of the amplifier and to compensate in part for changes that may occur in gain due to a change in component values. The negative feedback used decreases the voltage on the bases of the transistors 23 and 24 and places these bases at a lower potential, thereby increasing the effect of ideally having a zero input impedance.

Figure 2:
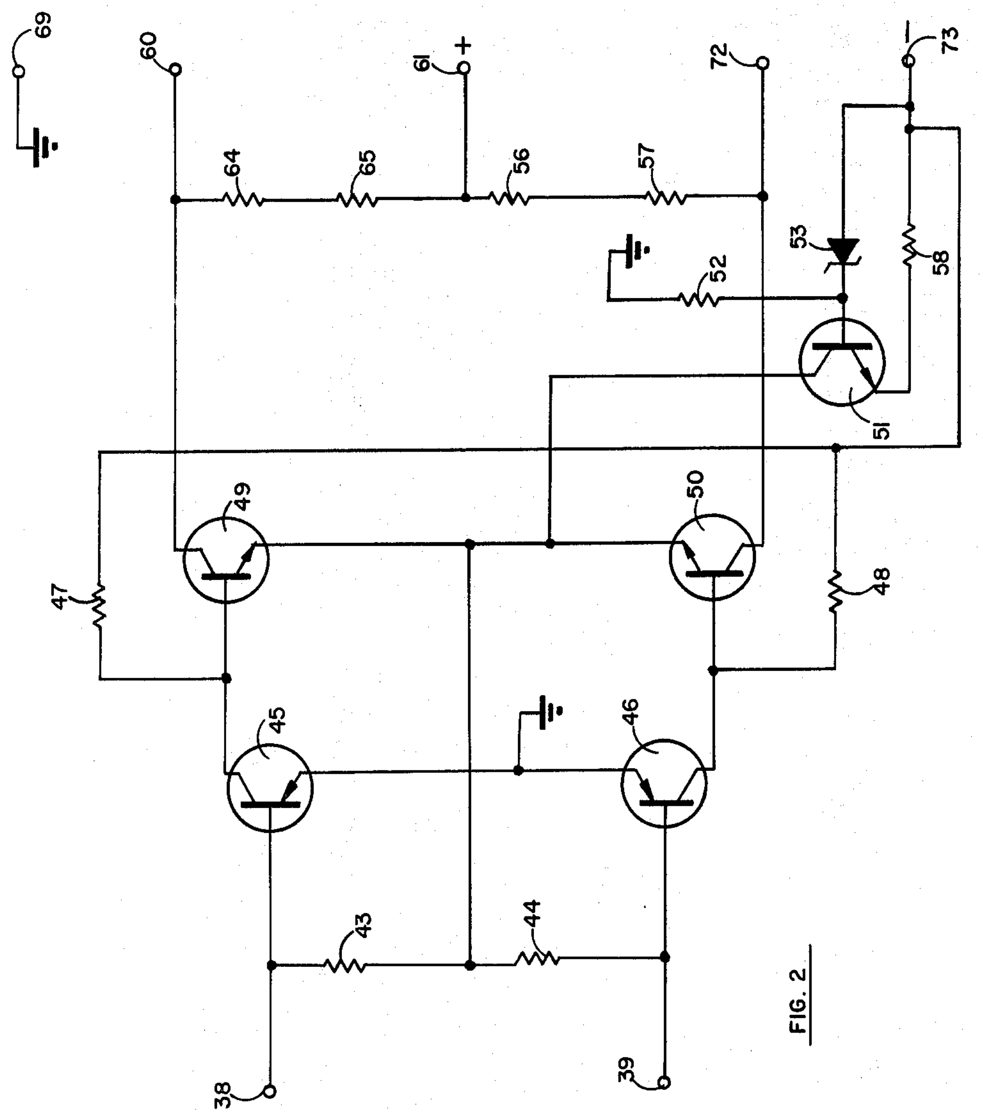
FIG. 2 is a schematic diagram of a modification of the apparatus of FIG. 1.

Referring to FIG. 2, the transistor amplifier includes two PNP transistors 45 and 46 and three NPN transistors 49, 50 and 51, each transistor having a base, emitter and collector. The input currents (not shown), of which the difference is to be measured, are applied to terminals 38 and 39 and are referenced to terminal 69 (ground).

Terminal 38 is connected to the base of transistor 45 and terminal 39 is connected to the base of transistor 46. The emitters of transistors 45 and 46 are connected to terminal 69. The collectors of transistors 45 and 46 are connected through resistors 47 and 48 respectively to terminal 73.

A voltage source (not shown) that is negative with respect to terminal 69 is connected from terminal 73 to terminal 69. The collector of transistor 45 is connected to the base of transistor 49, and the collector of transistor 46 is connected to the base of transistor 50. The emitters of transistors 49 and 50 are connected together and are connected to the bases of transistors 45 and 46 through resistors 43 and 44 respectively. Resistors 43 and 44 are a means by which negative feedback of the common mode current signal is accomplished. The emitters of transistors 49 and 50 are also connected to the collector of transistor 51. The collector of transistor 49 is connected by resistors 64 and 65 connected in series to terminal 61. A voltage source (not shown) which is positive with respect to terminal 69 is connected from terminal 61 to terminal 69. The collector of transistor 50 is connected by resistors 56 and 57 connected in series to terminal 61. The base of transistor 51 is connected by resistor 52 to terminal 69 and by Zener diode 53 to terminal 73. The cathode of Zener diode 53 is connected to the base of transistor 51. The emitter of transistor 51 is connected by resistor 58 to terminal 73. This particular transistor configuration furnishes a constant current source for the output stage. The collectors of transistors 49 and 50 are connected to terminals 60 and 72 respectively. The differential output voltage is detected across terminals 60 and 72. Terminal 69 is connected to ground and serves as a signal and voltage reference point.

In operation of the apparatus of FIG. 2, it will be assumed for the purpose of analysis that the base-to-collector current-amplification factor, $\beta$, is a constant for transistors 45, 46, 49 and 50; that transistors 45 and 46, and transistors 49 and 50, are matched pairs; that resistors 43 and 44 are equal in value; that resistors 47 and 48 are equal in value; and that the series combination of resistors 64 and 65 is equal in value to the series combination of resistors 56 and 57. It will also be assumed that the emitter-base diode drop of transistors 45, 46, 49, 50 and 51 is .5 volt and is constant for all values of base current other than zero.

The voltage at terminal 73 is negative with respect to ground, this negative voltage biases the base emitter junction of transistor 51 in the forward direction. A base current then flows from ground, through resistor 52, through the base emitter junction of transistor 51 and through resistor 58 to the negative voltage source. The Zener diode 53 controls the base current flow through transistor 51 such that the base current remains a constant. A negative voltage occurs on the collector of transistor 51 due to the negative voltage present on the base and the emitter of transistor 51. This negative voltage biases transistors 45, 46, 49 and 50 into conduction.

The current that flows into terminal 38 will be called $I_3$ and the current into terminal 39 will be called $I_4$. The currents $I_3$ and $I_4$ flow through resistors 43 and 44 respectively to the negative potential on the collector of transistor 51. Currents $I_3$ and $I_4$ create a change in the base currents of transistors 45 and 46, these current changes are amplified in transistors 45 and 46 by a factor of $\beta$ and appear on the collectors of transistors 45 and 46 as a voltage $-\epsilon\beta$. Neglecting the diode drop of transistors 49 and 50 the voltage $-\epsilon\beta$ will occur on the emitters of transistors 49 and 50. This voltage will in turn occur on the collector of transistor 51 and the junction of resistors 43 and 44.

Common mode current rejection is accomplished in this particular circuit by feeding back the voltage $-\epsilon\beta$ to the junction of resistors 43 and 44 to change the bias applied to transistors 45 and 46.

The voltage on the bases of transistors 49 and 50 control the amount of current that may flow through the collector-emitter junctions of transistors 49 and 50 and the load resistors 56, 57, 64 and 65. The current that flows from terminal 61 through resistors 64 and 65 is equal to the current that flows through resistors 56 and 57 when the differential input current is zero. The differential voltage developed across terminals 60 and 72 will then be zero. If an unbalance in the input currents $I_3$ and $I_4$ occurs, the voltages generated due to the currents flowing through resistors 43 and 44 will be different in magnitude; this difference in voltage magnitudes on the bases of transistors 45 and 46 will be amplified, and a corresponding voltage differential will be felt across output terminals 60 and 72. Transistor 51 is connected in a circuit configuration, commonly called a constant current generator. This configuration is used to increase the impedance of the output stage, by simulating a large resistor connected between terminal 73 and the emitters of transistors 49 and 50.

The potentials at the bases of transistors 45 and 46 are approximately zero due to the grounded emitter connections of transistors 45 and 46. Impedances placed from terminals 38 and 39 to ground would therefore draw very small currents. The object of having a near zero input impedance to common mode currents is thereby obtained.

It is to be noted that although FIG. 1 and FIG. 2 do not show resistors connecting the emitters of transistors 23, 24, 45 and 46 to ground, resistors may be inserted at the above points in place of connecting the emitters directly to ground. The operation of the circuits shown in FIG. 1 and FIG. 2 will be changed only slightly in that the input impedance will increase to a value directly proportional to the magnitude of the resistors inserted.

Typical component values for all embodiments might be as follows:

| | | |
|---|---|---|
| Resistors **13, 14, 43** and **44** | kilohms | 6.8 |
| Resistors **34, 35, 47** and **48** | do | 10 |
| Resistors **15** and **16** | do | 20 |
| Resistors **17, 20, 64** and **57** | do | 3.6 |
| Resistors **18, 19, 56** and **65** | ohms | 400 |
| Resistor **52** | kilohms | 5 |
| Resistor **58** | do | 2 |
| Zener diode **53** | | 1N807 |
| Transistors **23** and **24** | | SS71059 |
| Transistors **21** and **22** | | SS71060 |
| Transistors **45** and **46** | | SS71060 |
| Transistors **49** and **50** | | SS71059 |
| Transistor **51** | | 2N1893 |
| Direct-current source to terminals **26** and **61** | volts | +12 |
| Direct-current source to terminals **28** and **73** | do | −12 |

Where NPN transistors have been shown, they may be replaced by PNP transistors with appropriate changes in circuitry to provide for the different polarities.

The specific embodiments shown and discussed have been shown to illustrate the principles of the invention. It is to be clearly understood that the same is by way of illustration and example only and is not to be taken by way of limitation; the spirit and scope of this invention being limited only by the terms of the appended claims.

I claim:

1. In combination:

a first, second, third, and fourth transistor, each having a base, an emitter, and a collector, the emitters of said first and second transistors being connected together;

the collector of said first transistor being connected to the base of said third transistor, the collector of said second transistor being connected to the base of said fourth transistor, the emitters of said third and fourth transistors being connected together;

a first and second current source, having a common terminal connected to the emitters of said first and second transistors with the uncommon terminal of said first source being connected to the base of said first transistor and the uncommon terminal of said second source being connected to the base of said second transistor;

a first resistor connecting the base of said first transistor and the emitter of said third transistor;

a second resistor, whose resistance is equal in value to the resistance of said first resistor, connecting the base of said second transistor to the emitter of said fourth transistor;

a first voltage source;

a third resistor connecting said first voltage source to the collector of said third transistor and to said common terminal;

a fourth resistor connecting said first voltage source to the collector of said fourth transistor;

a fifth resistor connecting the collector of said third transistor to the base of said second transistor;

a sixth resistor connecting the collector of said fourth transistor to the base of said first transistor;

a second voltage source;

a seventh resistor connecting said second voltage source to the base of said fourth transistor and to said common terminal;

an eighth resistor connecting said second voltage source to the base of said third transistor;

a fifth transistor having an emitter, a base, and a collector, the collector of said fifth transistor being connected to the emitter of said fourth transistor;

a ninth resistor connecting the base of said fifth transistor to said common terminal;

a tenth resistor connecting said second voltage source to the emitter of said fifth transistor;

a Zener diode conected between the base of said fifth transistor and said second voltage source;

means for detecting an output signal.

2. A transistor amplifier comprising:

first and second terminals for supply voltage sources and a third terminal for voltage reference;

a first transistor, a second transistor, a third transistor, and a fourth transistor, each having an emitter, a base and a collector;

the bases of said third and fourth transistors being connected direct-current conductively to the collectors of said first and second transistors respectively;

the emitters of said first and second transistors being connected direct-current conductively to said third terminal;

a first and second load resistor connecting the collectors of said first and second transistors respectively to said first terminal;

a bias resistor connecting the base of said first transistor to said first terminal, a bias resistor connecting the base of said second transistor to said first terminal;

the emitters of said third and fourth transistors being connected to said first terminal;

a second and third load resistor connected in series and connecting the collector of said third transistor to said second terminal;

a fourth and fifth load resistor connected in series and connecting the collector of said fourth transistor to said second terminal;

a first feedback resistor connecting the junction of said second and third load resistors to the base of said second transistor;

a second feedback resistor connecting the junction of said fourth and fifth load resistors to the base of said first transistor;

a pair of input terminals connected to the bases of said first and second transistors respectively;

a current signal source connecting said input terminals to said third terminal.

3. In combination:

first and second transistors of like conductivity type;

a direct-current conductive connection from the emitter of said first transistor and the emitter of said second transistor to a common point;

means for applying a signal between the base electrodes of said first and second transistors and said common point;

a third transistor of type complementary to said first transistor having its base connected to the collector of said first transistor;

a fourth transistor of type complementary to said second transistor having its base connected to the collector of said second transistor;

a first resistor connecting the collector of said third transistor to a first junction point;

a second resistor connecting a first power supply from said common point to said first junction point;

a third resistor connecting the collector of said fourth transistor to a second junction point;

a fourth resistor connecting said first power supply to said second junction point;

a fifth resistor connecting said first junction point to the base of said second transistor;

a sixth resistor connecting said second junction point to the base of said first transistor;

a seventh and eighth resistor connecting a second power supply from said common point to the bases of said first and second transistors respectively;

a direct-current conductive connection from the emitters of said third and fourth transistors to said second power supply;
a ninth and tenth resistor connecting the collection of said first and second transistors respectively to said second power supply;
a means for detecting the output signal.

4. In combination:
first and second transistors of like conductivity type;
a direct-current conductive connection from the emitter of said first transistor and the emitter of said second transistor to a common point;
means for applying a signal between the base electrodes of said first and second transistors and said common points;
a third transistor of type complementary to said first transistor having its base connected to the collector of said first transistor;
a fourth transistor of type complementary to said second transistor having its base connected to the collector of said second transistor;
a first resistor connecting the collector of said third transistor to a first junction point;
a second resistor connecting a first voltage source from said common point to said first junction point;
a third resistor connecting the collector of said fourth transistor to a second junction point;
a fourth resistor connecting said first voltage source to said second junction point;
a fifth resistor connecting said first junction point to the base of said second transistor;
a sixth resistor connecting said second junction point to the base of said first transistor;
a seventh and eighth resistor connecting a constant current source from said common point to the bases of said first and second transistors respectively;
a direct-current conductive connection from the emitters of said third and fourth transistors to said constant current source;
a ninth and tenth resistor connecting the collectors of said first and second transistors respectively to a second voltage source;
a means for detecting the output signal.

5. A device substantially as claimed in claim 4 with the collector of said third or fourth transistor connected to said common point.

6. A device substantially as claimed in claim 4 with said fifth resistor connecting said first junction point to the base of said first transistor, and said sixth resistor connecting said second junction point to the base of said second transistor.

7. In combination:
first and second transistors of like conductivity type;
a direct-current conductive connection from the emitter of said first transistor and the emitter of said second transistor to a common point;
means for applying a signal between the base electrodes of said first and second transistors and said common point;
a third transistor of type complementary to said first transistor having its base connected with the collector of said first transistor;
a fourth transistor of type complementary to said second transistor having its base connected with the collector of said second transistor;
an output device including a first power supply connecting the collectors of said third and fourth transistors respectively to said common point;

a direct-current conductive connection from the emitter of said third transistor to the emitter of said fourth transistor;
a first and second resistor connecting the base of said first and said second transistor, respectively, to the emitter of said fourth transistor;
a second power supply;
means connecting said second power supply between the emitter of said fourth transistor and said common point;
a third and fourth resistor connecting the collectors of said first and second transistors, respectively, to said second power supply.

8. In combination:
first and second transistors of like conductivity type;
a direct-current conductive connection from the emitter of said first transistor and the emitter of said second transistor to a common point;
means for applying a signal between the base of said first and second transistors and said common point;
a third transistor of a type complementary to said first transistor having its base connected to the collector of said first transistor;
a fourth transistor of a type complementary to said second transistor having its base connected to the collector of said second transistor;
a first resistor connecting the collector of said third transistor to a first junction point;
a second resistor connecting a first power supply from said common point to said first junction point;
a third resistor connecting the collector of said fourth transistor to a second junction point;
a fourth resistor connecting said first power supply to said second junction point;
a fifth resistor connecting said first junction point to the base of said second transistor;
a sixth resistor connecting said second junction point to the base of said first transistor;
a direct-current conductive connection from the emitter of said third transistor to the emitter of said fourth transistor;
a seventh and eighth resistor connecting the emitter of said fourth transistor to the base of said first transistor and the base of said second transistor, respectively;
a second power supply;
means serially connecting said second power supply from said common point to the emitter of said fourth transistor;
a ninth and tenth resistor connecting the collectors of said first and second transistors, respectively, to said second power supply;
a means for detecting the output signal present across the collectors of said third and fourth transistors.

References Cited by the Examiner

UNITED STATES PATENTS

| | | | |
|---|---|---|---|
| 3,013,104 | 12/1961 | Young. | |
| 3,036,274 | 5/1962 | Greatbatch. | |
| 3,042,875 | 7/1962 | Higginbotham | 330—17 |
| 3,042,876 | 7/1962 | Pegram. | |
| 3,046,487 | 7/1962 | Matzen et al. | 330—30 X |
| 3,105,198 | 9/1963 | Higginbotham | 330—17 X |

ROY LAKE, *Primary Examiner.*

F. D. PARIS, *Assistant Examiner.*